(12) United States Patent
Ohnishi

(10) Patent No.: US 12,316,299 B2
(45) Date of Patent: May 27, 2025

(54) CRYSTAL VIBRATION DEVICE

(71) Applicant: DAISHINKU CORPORATION, Kakogawa (JP)

(72) Inventor: Manabu Ohnishi, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 961 days.

(21) Appl. No.: 17/429,922

(22) PCT Filed: Jan. 30, 2020

(86) PCT No.: PCT/JP2020/003385
§ 371 (c)(1),
(2) Date: Aug. 10, 2021

(87) PCT Pub. No.: WO2020/195144
PCT Pub. Date: Oct. 1, 2020

(65) Prior Publication Data
US 2022/0131518 A1 Apr. 28, 2022

(30) Foreign Application Priority Data
Mar. 27, 2019 (JP) .................. 2019-060001

(51) Int. Cl.
*H03H 9/05* (2006.01)
*H03H 9/02* (2006.01)
*H03H 9/19* (2006.01)
(52) U.S. Cl.
CPC ...... *H03H 9/0595* (2013.01); *H03H 9/02157* (2013.01); *H03H 9/19* (2013.01)

(58) Field of Classification Search
CPC ..... H03H 9/0595; H03H 9/02157; H03H 9/19
See application file for complete search history.

(56) References Cited

U.S. PATENT DOCUMENTS 6,251,507 B1 6/2001 Yamamoto et al.
2013/0002096 A1* 1/2013 Umeki .................. H03H 9/105
29/25.35

(Continued)

FOREIGN PATENT DOCUMENTS

JP 11-136076 A 5/1999
JP 2000-103010 A 4/2000

(Continued)

OTHER PUBLICATIONS

English Translation of JP 2012015824 (Year: 2012).*

(Continued)

*Primary Examiner* — Bryan P Gordon
(74) *Attorney, Agent, or Firm* — Norris McLaughlin, P.A.

(57) ABSTRACT

An AT-cut crystal vibration plate has, at its both ends, first and second castellations that interconnect first mounting terminals and also interconnect second mounting terminals formed on main surfaces on both sides of this plate. The first and second castellations respectively have first and second cutouts, and these cutouts each have an end surface extending along Z' axis of crystal and located on a −X-axis side. The end surfaces each include a first inclined face inclined in a manner that protrudes from one of the main surfaces toward the −X-axis side, and a second inclined face inclined in a manner that protrudes from the other main surface toward the −X-axis side. The angle made by the first inclined face and the second inclined face is an obtuse angle.

17 Claims, 10 Drawing Sheets

(56) References Cited

U.S. PATENT DOCUMENTS

| | | | | |
|---|---|---|---|---|
| 2013/0241358 A1* | 9/2013 | Mizusawa | ................. | G03F 7/40 |
| | | | | 430/316 |
| 2013/0320811 A1* | 12/2013 | Mizusawa | ............ | H03H 9/0595 |
| | | | | 310/348 |
| 2015/0155469 A1* | 6/2015 | Ariji | .................... | H03H 9/0595 |
| | | | | 310/344 |
| 2020/0358422 A1* | 11/2020 | Northcutt | ................. | H03H 9/10 |

FOREIGN PATENT DOCUMENTS

| JP | 2005-184325 A | 7/2005 |
|---|---|---|
| JP | 2006-339661 A | 12/2006 |
| JP | 2012-15824 A | 1/2012 |
| JP | 2012-195630 A | 10/2012 |
| JP | 2012-257158 A | 12/2012 |
| JP | 2013-192052 A | 9/2013 |
| JP | 2014-30126 A | 2/2014 |
| JP | 2015-70582 A | 4/2015 |
| JP | 2015-167305 A | 9/2015 |

OTHER PUBLICATIONS

English Translation of JP 2012257158 (Year: 2012).*
Koga, Isaac: "Radio-Frequency Vibrations of Rectangular AT-Cut Quartz Plates", Journal of Applied Physics, vol. 34, No. 42, Jul. 18, 1963, pp. 2357-2365, XP055953257.
Extended European Search Report issued Aug. 30, 2022.

* cited by examiner

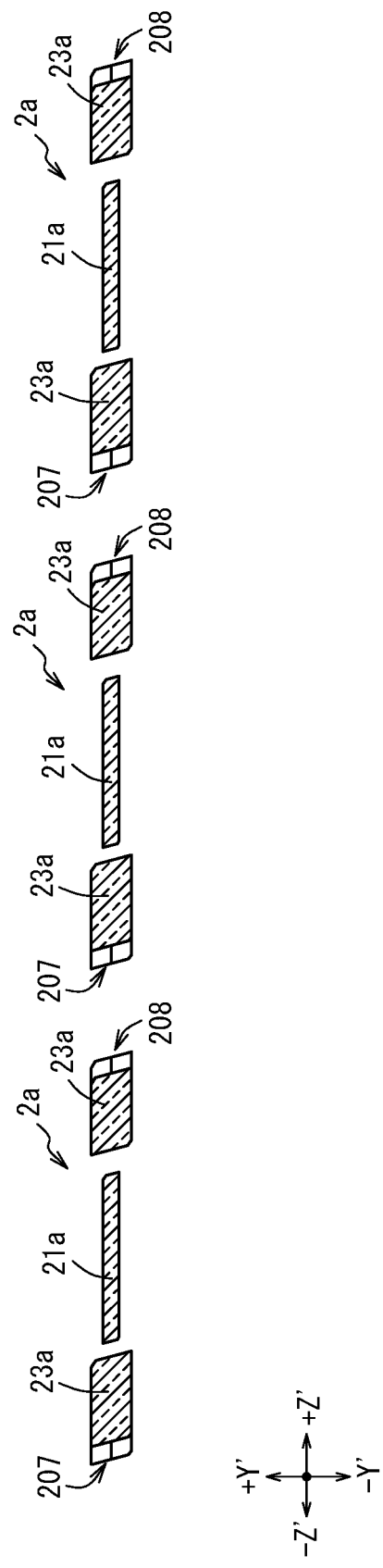

CRYSTAL VIBRATION DEVICE

TECHNICAL FIELD

This present invention relates to a crystal vibration device, examples of which may include crystal vibrators.

BACKGROUND ART

Surface-mounted crystal vibrators are typical examples of the crystal vibration devices which have been and are currently used in a broad range of applications. Patent document 1 describes an example of such surface-mounted crystal vibrators. In the crystal vibrator of this example is used a ceramic-made, box-shaped base having an opening on its upper side. A crystal vibration piece (crystal piece) is mounted on this base in the following manner; electrodes are led out from driving electrodes formed on surfaces on both sides of the crystal vibration piece, and these led-out electrodes are fixedly joined, with an electrically conductive adhesive, to electrodes held in the base. Then, a lid member is firmly joined to the opening of the base mounted with the crystal vibration piece, so that the base is air-tightly sealed. On an outer bottom surface of the base are formed terminals for surface mounting of this crystal vibrator.

CITATION LIST

Patent Document

Patent Document 1: JP 2005-184325 A

SUMMARY OF INVENTION

Technical Problems

In the crystal vibrators as described above, the package is mostly so structured that a metal or glass-made lid member is joined to a ceramic base. Such packages are often costly, which may inevitably lead to higher prices of the crystal vibrators.

To address such cost-related issues of the known art, the present invention is directed to providing an inexpensive crystal vibration device.

When a crystal plate used in a crystal vibrator is being processed by wet etching to form its outer shape, lateral surfaces of this plate, because of crystal anisotropy during the etching associated with crystal orientation, may be often variable in shape depending on where the crystal axis is directed. The lateral surfaces of the crystal plate may accordingly have right-angled or sharp-angled corners.

The electrodes, if routed in such right-angled or sharp-angled corners of the lateral surfaces, may be reduced in thickness at the corners. Another problem with such electrodes is a high risk of damage, wear or breakage because they are exposed to outside.

To address these additional issues, the present invention is also directed to finding solutions to prevent breakage in order to improve the reliability of electrical connection.

Solutions to the Problems

To this end, the present invention provides the following technical features.

A crystal vibration device according to the present invention includes:

an AT-cut crystal vibration plate having a first driving electrode and a second driving electrode, the first driving electrode being formed on one of main surfaces on both sides of the AT-cut crystal vibration plate, the second driving electrode being formed on the other one of the main surfaces, the AT-cut crystal vibration plate further having first and second mounting terminals that are respectively connected to the first and second driving electrodes; and first and second sealing members that are respectively joined to the main surfaces on both sides of the AT-cut crystal vibration plate in a manner that the first and second driving electrodes of the AT-cut crystal vibration plate are covered with the first and second sealing members.

The crystal vibration device according to the present invention is also characterized in that, the first mounting terminals are formed on both of the main surfaces at one end of the AT-cut crystal vibration plate, the second mounting terminals are formed on both of the main surfaces at the other end of the AT-cut crystal vibration plate, a first castellation and a second castellation are respectively formed at the one end and at the other end of the AT-cut crystal vibration plate, and the first and second castellations are each formed by depositing an electrode on a cutout formed from the one of the main surfaces to the other one of the main surfaces.

The crystal vibration device according to the present invention is further characterized in that, the first castellation and the second castellation serve to interconnect the first mounting terminals and to interconnect the second mounting terminals that are respectively formed on the main surfaces, the cutouts of the first and second castellations each include end surfaces extending along Z' axis and located on a −X-axis side of X axis of crystal, the end surfaces on the −X-axis side each include a first inclined face and a second inclined face, the first inclined faces being each inclined from the one of the main surfaces to the other one of the main surfaces in a manner that protrudes toward the −X-axis side, the second inclined faces being each inclined from the other one of the main surfaces to the one of the main surfaces in a manner that protrudes toward −X-axis side, the second inclined face being continuous to the first inclined face, and an angle made by the first and second inclined faces is an obtuse angle.

According to the present invention, the AT-cut crystal vibration plate is provided with the first and second mounting terminals that are respectively connected to the first and second driving electrodes. Thus, the crystal vibration device may be mounted on, for example, a circuit board by bonding the first and second mounting terminals to the board with a bonding material such as solder, metallic bump, and/or wire Conventionally, crystal vibration pieces may often have to be mounted in bases where the mounting terminals are disposed. This, however, may no longer be necessary according to the present invention and may accordingly eliminate the need to prepare high-priced bases.

The first, second castellation is so structured that the electrode is deposited on the cutout. As compared with an electrode formed on an uncut outer surface, the electrode thus deposited on the cutout may be dented inward and unlikely to be worn, damaged or broken. The cutouts of the first and second castellations each include end surfaces extending along the Z axis and located on the –X-axis side of crystal. The end surfaces on the –X-axis side each have inclined faces; first inclined face inclined from the one of the main surfaces to the other one of the main surfaces in a manner that protrudes toward the –X-axis side, and second inclined face inclined from the other one of the main surfaces to the one of the main surfaces in a manner that protrudes toward the –X-axis side. Because the angle made by the first and second inclined faces is an obtuse angle, the risk of the electrodes being reduced in thickness may be unlikely, in contrast to electrodes formed at right-angled or sharp-angled corners. This may prevent such an unfavorable event as breakage, improving the reliability of electrical connection between the first mounting terminals and between the second mounting terminals on the main surfaces.

The crystal vibration device may preferably be characterized in that dimensions of the cutouts in a direction along the Z' axis on at least one of the main surfaces are greater than or equal to 85% of the thickness of the AT-cut crystal vibration plate.

By setting the cutouts to have such dimensions, the first and second inclined faces may certainly be formed by etching in the end surfaces extending along the Z axis.

The crystal vibration device may preferably be characterized in that dimensions of the cutouts in a direction along the X axis on at least one of the main surfaces are greater than or equal to 120% of the thickness of the AT-cut crystal vibration plate.

By setting the cutouts to have such dimensions, the cutouts may certainly be penetrated through the main surfaces, and the first and second inclined faces may certainly be formed by etching in the end surfaces on the –X-axis side.

The crystal vibration device may be characterized in that the AT-cut crystal vibration plate has a rectangular shape in plan view, and the first castellation and the second castellation are respectively formed at central positions on opposing sides of the rectangular shape in a direction along the X axis.

After the first and second mounting terminals formed on the AT-cut crystal vibration plate are bonded to, for example, a circuit board with a solder, a stress from the solder may be acted upon these mounting terminals. Such a stress, however, may be equalized by forming the first and second castellations at central positions on opposing sides along the X axis of this vibration plate.

The crystal vibration device may be characterized in that at least one of the first and second sealing members is a film including a resin.

By thus using a resinous film for at least one of the first and second sealing members, high-priced bases or metal-made or glass-made bases may become unnecessary, and cost reduction may be favorably achieved in the production of crystal vibration devices.

The crystal vibration device may be characterized in that the AT-cut crystal vibration plate includes: a vibrating portion including the first and second driving electrodes formed on the main surfaces on both sides; and an outer frame surrounding an outer circumference of the vibrating portion and coupled to the vibrating portion through a coupling portion. The crystal vibration device may be further characterized in that the vibrating portion is smaller in thickness than the outer frame, and circumferential ends of the film are respectively joined to main surfaces on both sides of the outer frame to seal the vibrating portion.

The circumferential ends of the film are thus respectively joined to the main surfaces on both sides of the outer frame that surround the outer circumference of the thinner vibrating portion. This may allow the vibrating portion to be sealed without any contact with the film joined to the main surfaces on both sides of the outer frame.

The crystal vibration device may be characterized in that a first sealing pattern is formed on one of the main surfaces on both sides of the outer frame, the first sealing pattern being a pattern to which the film is joined, the first sealing pattern being a pattern that surrounds the vibrating portion and that interconnects the first driving electrode and the first mounting terminal. The crystal vibration device according to this embodiment may be further characterized in that a second sealing pattern is formed on the other one of the main surfaces on both sides of the outer frame, the second sealing pattern being a pattern to which the film is joined, the second sealing pattern being a pattern that surrounds the vibrating portion and that interconnects the second driving electrode and the second mounting terminal.

Thus, the first and second sealing patterns respectively formed on the main surfaces of the outer frame may provide electrical connection between the first driving electrode and the first mounting terminal and between the second driving electrode and the second mounting terminal. Further advantageously, the vibrating portion may be reliably sealed by having the film firmly bonded to the first and second sealing patterns that surround the vibrating portion.

The crystal vibration device may be characterized in that the first sealing pattern and the second sealing pattern each have an extended portion extending along the Z' axis, and the extended portions have a width smaller than a width of the outer frame extending along the Z' axis.

In case the extended portions of the two sealing patterns are formed in an equal width to the outer frame, i.e., in case the extended portions are formed along the entire width of the outer frame, the extended portions on one and the other main surfaces may accidentally run around the lateral surfaces of the outer frame, possibly inviting short circuit to occur. On the other hand, the risk of short circuit may be avoided because, as described herein, the extended portion of the first sealing pattern formed on one of the main surfaces of the outer frame and the extended portion of the second sealing pattern formed on the other main surface are both smaller in width than the outer frame. This may successfully avoid the occurrence of short circuit.

The crystal vibration device may be characterized in that the film includes a heat-resistant resin.

Thus, the film used to seal the vibrating portion of the crystal vibration plate is made of a heat-resistant resin. The film made of such a material may be unlikely to deform during reflow soldering employed at the time when the crystal vibration device is mounted on a target object.

The crystal vibration device may be characterized in that the film includes a thermoplastic adhesive layer on at least one surface thereof.

A surface of the film, on which the thermoplastic adhesive layer is formed, may be joined under heat by pressure bonding to the crystal vibration plate.

Advantageous Effects of the Invention

In the crystal vibration device according to the present invention, the crystal vibration plate is provided with the first and second mounting terminals that are respectively connected to the first and second driving electrodes. These mounting terminals may facilitate the process of the crystal vibration device being mounted on, for example, a circuit board. Conventionally, crystal vibration pieces may often have to be mounted in bases where the mounting terminals are disposed. This, however, may no longer be necessary according to the present invention and may accordingly eliminate the need to prepare high-priced bases, leading to cost reduction.

The first, second castellation is so structured that the electrode is deposited on the cutout. As compared with an electrode formed on an uncut outer surface, the electrode thus deposited on the cutout may be dented inward and unlikely to be worn, damaged or broken. The cutouts of the first and second castellations each include end surfaces extending along the Z axis and located on the −X-axis side. The end surfaces on the −X-axis side each have inclined faces; first inclined face inclined from the one of the main surfaces and protruding toward the −X-axis side, and second inclined face inclined from the other one of the main surfaces and protruding toward the −X-axis side, and the angle made by these first and second inclined faces is an obtuse angle. This structural feature may effectively reduce the risk of breakage as compared with electrodes deposited at right-angled or sharp-angled corners, improving the reliability of electrical connection between the first mounting terminals and between the second mounting terminals on the main surfaces.

BRIEF DESCRIPTION OF DRAWINGS

FIG. 7B is a schematic view in cross section of the crystal vibrator illustrated to describe steps of manufacturing the crystal vibrator of FIG. 1.

DESCRIPTION OF EMBODIMENTS

An embodiment of the present invention is hereinafter described in detail referring to the accompanying drawings.

In the description of this embodiment that follows, a crystal vibrator is used as an example of the crystal vibration device.

Figure 1:
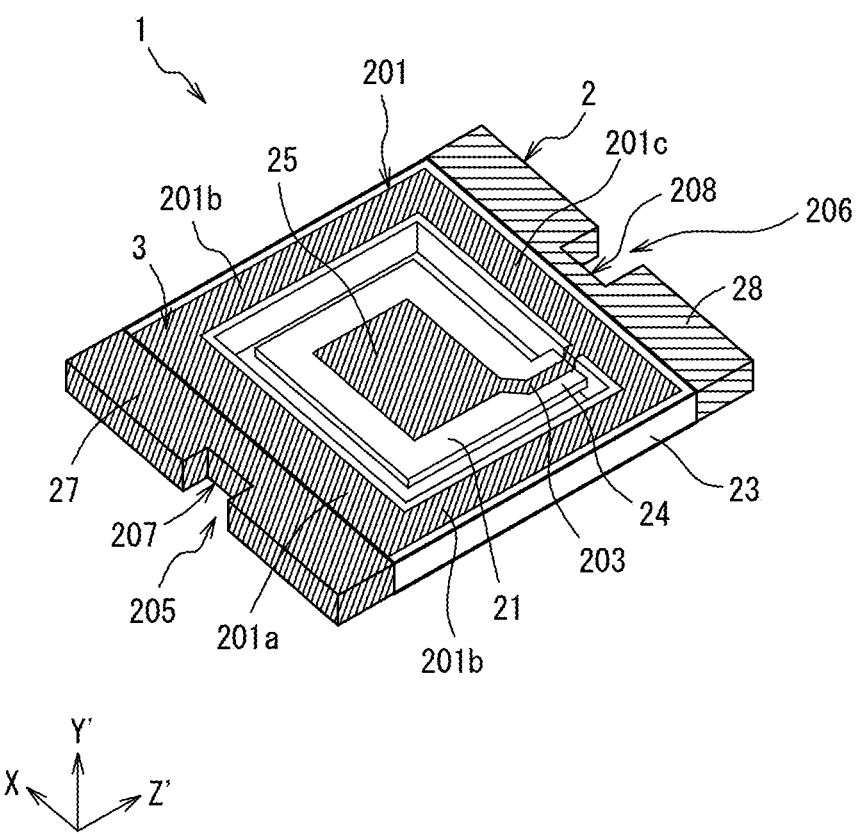
FIG. 1 is a schematic perspective view of a crystal vibrator according to an embodiment of the present invention.
Figure 2:
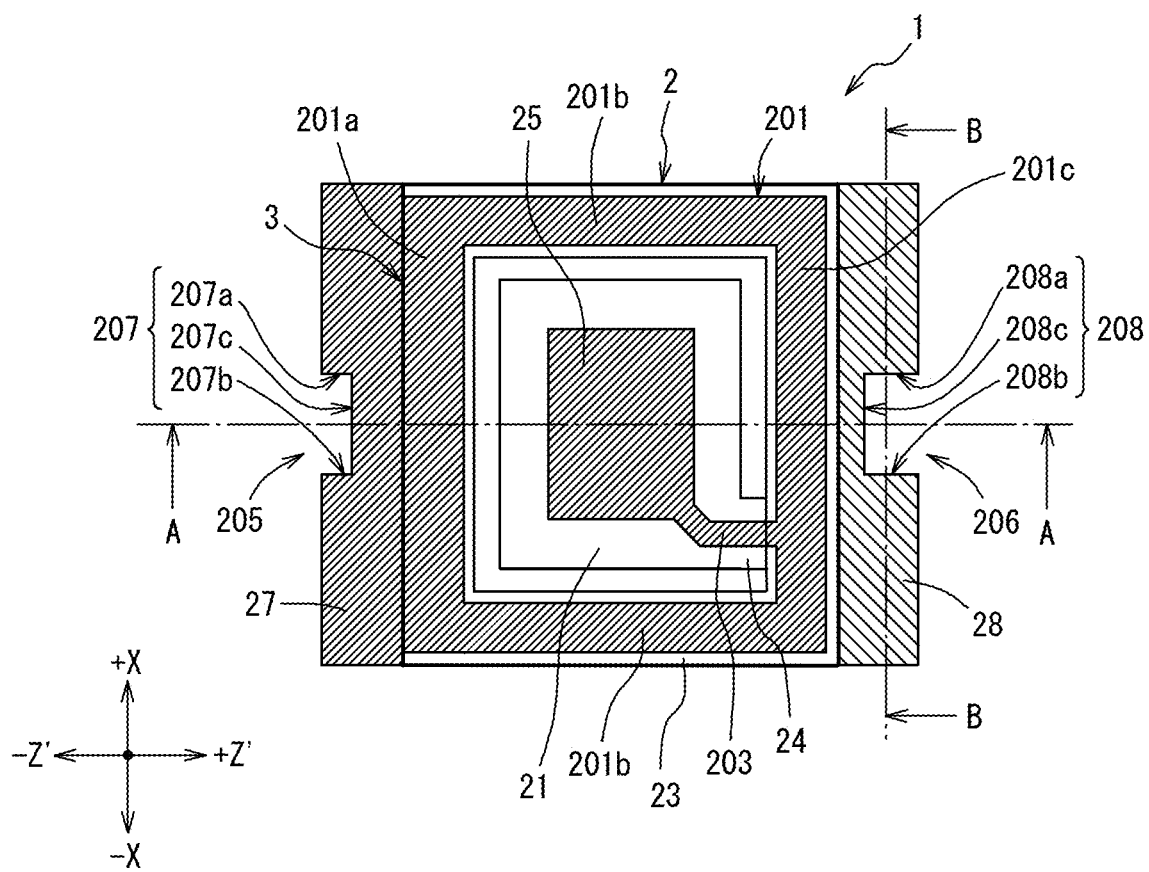
FIG. 2 is a schematic plan view of the crystal vibrator illustrated in FIG. 1.
Figure 3:
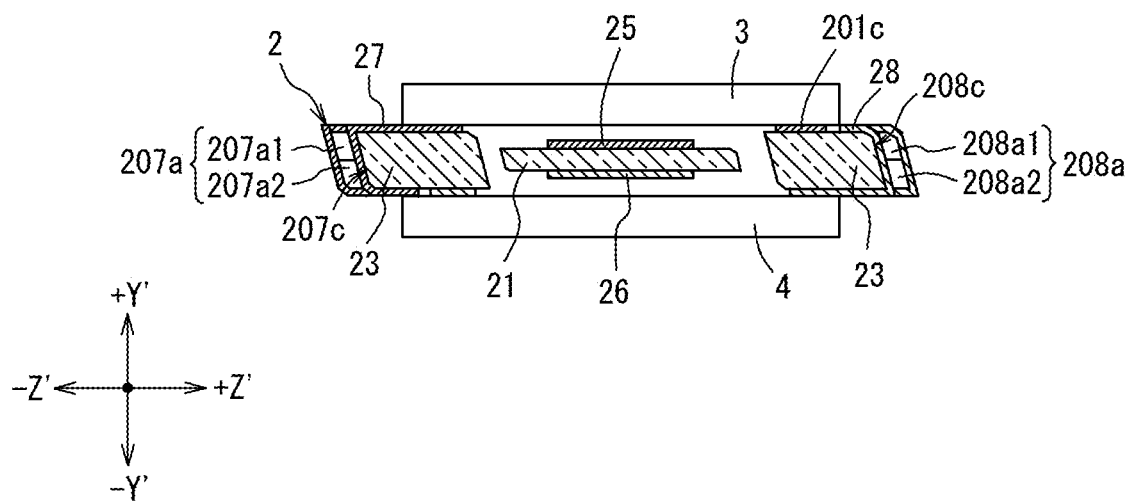
FIG. 3 is a schematic view in cross section of the crystal vibrator along A-A line illustrated in FIG. 2.
Figure 4:
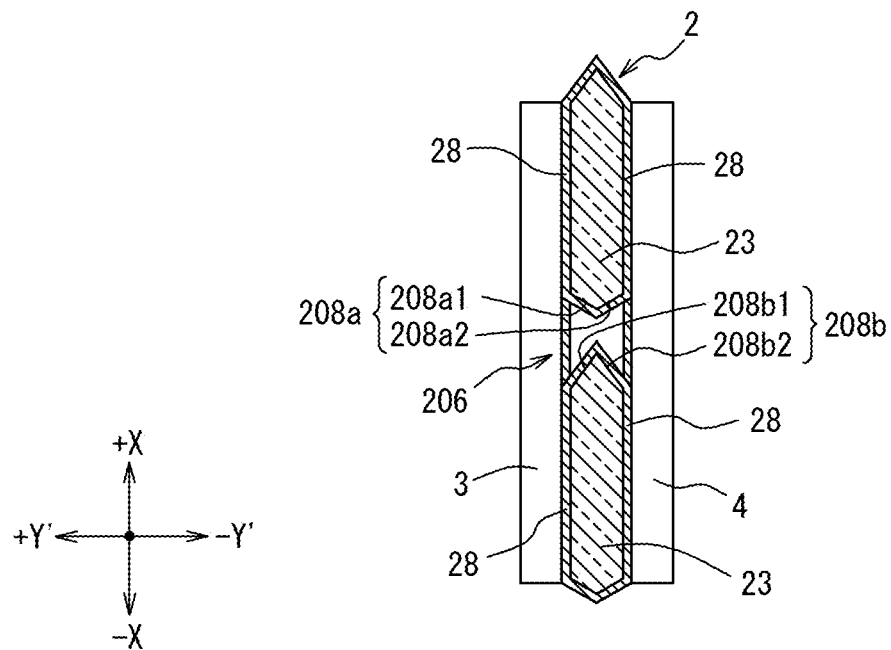
FIG. 4 is a schematic view in cross section of the crystal vibrator along B-B line illustrated in FIG. 2.

FIG. 1 is a schematic perspective view of a crystal vibrator according to an embodiment of the present invention. FIG. 2 is a schematic plan view of the crystal vibrator illustrated in FIG. 1. FIG. 3 is a schematic view in cross section of the crystal vibrator along A-A line illustrated in FIG. 2. FIG. 4 is a schematic view in cross section of the crystal vibrator along B-B line illustrated in FIG. 2. In FIGS. 3, 4, 7D and 7E described later, the thickness of a resin film, for example, may be exaggerated for the purpose of illustration.

A crystal vibrator 1 according to this embodiment includes an AT-cut crystal vibration plate 2, a first resin film 3; first sealing member, and a second resin film 4; second sealing member. The first resin film covers and seals one of the front and back main surfaces of the AT-cut crystal vibration plate 2. The second resin film 4 covers and seals the other one of the front and back main surfaces of the AT-cut crystal vibration plate 2.

This crystal vibrator 1 has a cuboidal shape and is rectangular in plan view. In this embodiment, the crystal vibrator 1 is relatively small in size and height; 1.2 mm×1.0 mm square, and 0.2 mm thick.

The size and thickness of the crystal vibrator 1 are not necessarily limited to these dimensions which were only mentioned as an example. The crystal vibrator 1 may be formed in other sizes, to which the present invention is also applicable.

Next, the AT-cut crystal vibration plate 2 and the first and second resin films 3 and 4, which are structural elements of the crystal vibrator 1, are hereinafter described.

The AT-cut crystal vibration plate 2 according to this embodiment is an AT-cut crystal plate obtained by processing a rectangular crystal plate through 35° 15' rotation around X axis of crystal. In this AT-cut crystal vibration plate 2, new axes after the rotation are respectively Y' axis and Z' axis, and front and back main surfaces of this plate are XZ' planes.

Figure 5:
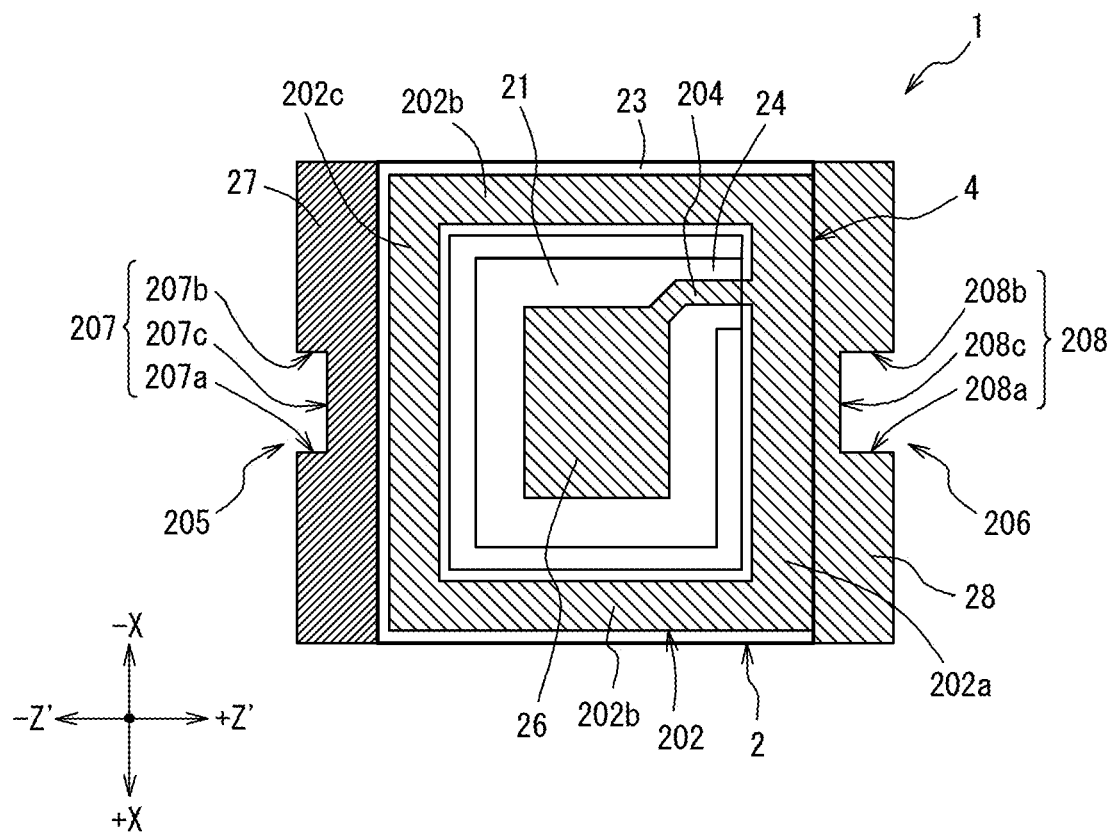
FIG. 5 is a schematic bottom view of the crystal vibrator illustrated in FIG. 1.

In the XZ' plane, X-axis direction refers to the direction along short sides of the rectangular crystal vibration plate 2 rectangular in plan view (vertical direction on FIGS. 2, 4 and 5), and Z'-axis direction refers to the direction along long sides of the rectangular crystal vibration plate 2 (lateral direction on FIGS. 2, 3 and 5).

The AT-cut crystal vibration plate 2 includes a vibrating portion 21, an outer frame 23, and a coupling portion 24. The vibrating portion 21 is substantially rectangular in plan view. The outer frame 23 each surround the vibrating portion 21 with a penetrating portion 24 being interposed therebetween. The coupling portion 24 is formed to couple the vibrating portion 21 to the outer frame 23. The vibrating portion 21, outer frame 23 and coupling portion 24 are formed as an integral unit. The vibrating portion 21 and the coupling portion 24 are formed in a smaller thickness than the outer frame 23.

In this embodiment, the vibrating portion 21 substantially rectangular in plan view is coupled to the outer frame 23 through the coupling portion 24 formed at one position; one corner, of the rectangular shape. This may reduce a stress possibly acted upon the vibrating portion 21, as compared with this portion being coupled to the outer frame at two or more positions.

Figure 8:
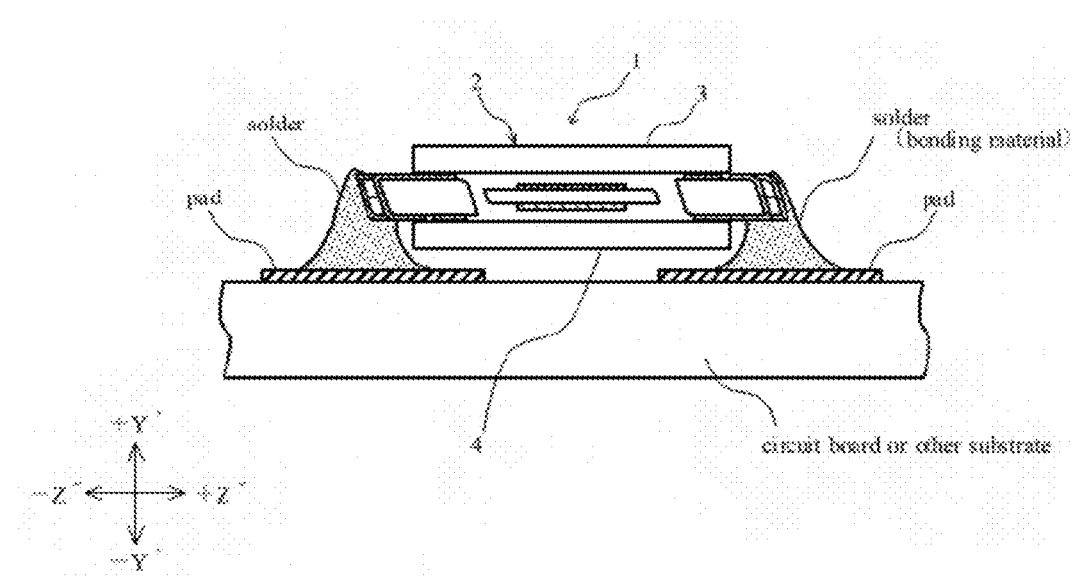
FIG. 8 is a schematic view of showing first and second mounting terminals of the crystal vibrator directly joined to a circuit board or other substrate.

In this embodiment, the coupling portion 24 protrudes from one side in the X-axis direction of an inner circumference of the outer frame 23 and then extends in the Z'-axis direction. The AT-cut crystal vibration plate 2 has, at its both ends in the Z'-axis direction, first and second mounting terminals 27 and 28, and these first and second mounting terminals 27 and 28 are directly joined to, for example, a circuit board with a solder as shown in FIG.8. As a result of these structural features, a contraction stress may possibly be generated in the long-side direction of the crystal vibrator (Z'-axis direction) and transmitted to the vibrating portion, in which case the crystal vibrator's oscillation frequency may be easily variable. In this embodiment, however, the coupling portion 24 is formed in a direction in which the contraction stress is transmittable. Thus, the contraction stress may be difficult to be transmitted to the vibrating portion 21. This may control the variability of the oscillation frequency at the time when the crystal vibrator 1 is mounted on a circuit board.

The vibrating portion 21 has, on its front and back main surfaces, a pair of first and second driving electrodes 25 and 26. In the outer frame 23 at both ends in the long-side direction of the rectangular AT-cut crystal vibration plate 2, first and second mounting terminals 27 and 28 are formed in the short-side direction of the AT-cut crystal vibration plate 2, and these first and second mounting terminals are respectively connected to the first and second driving electrodes 25 and 26. The first and second mounting terminals 27 and 28 are used to mount the crystal vibrator 1 on, for example, a circuit board.

On one of the main surfaces on both sides, the first mounting terminal 27 is continuous to a first sealing pattern 201 formed in a rectangular circular shape which will be described later, as illustrated in FIG. 2. On the other one of the main surfaces, the second mounting terminal 28 is continuous to a second sealing pattern 202 formed in a rectangular circular shape which will be described later, as illustrated in FIG. 5.

Thus, the first and second mounting terminals 27 and 28 are formed at both ends of the AT-cut crystal vibration plate 2 in the long-side direction (Z'-axis direction) across the vibrating portion 21 interposed between these mounting terminals.

The first mounting terminals 27 on the main surfaces of the AT-cut crystal vibration plate 2 are electrically interconnected, and the second mounting terminals 28 on the main surfaces of the AT-cut crystal vibration plate 2 are also electrically interconnected. In this embodiment, the first mounting terminals 27, as well as the second mounting terminals 28, are electrically interconnected through electrodes routed along lateral surfaces of opposing long sides of the AT-cut crystal vibration plate 2, and are also electrically interconnected through electrodes routed along lateral surfaces of opposing short sides of the AT-cut crystal vibration plate 2. On the short sides, these mounting terminals are electrically interconnected through first and second castellations 205 and 206, described later, in which electrodes are deposited on cutouts 207 and 208 formed from one of the main surfaces to the other.

On the front-surface side of the AT-cut crystal vibration plate 2 is formed a first sealing pattern 201 to which the first resin film 3 is joined, as illustrated in FIG. 2. The first sealing pattern 201 is formed in a rectangular circular shape in a manner that the rectangular vibrating portion 21 is surrounded by this sealing pattern. The first sealing pattern 201 includes a connecting portion 201a, first extended portions 201b, and a second extended portion 201c. The connecting portion 201a is continuous to the first mounting terminal 27. The first extended portions 201b extend from both ends of the connecting portion 201a in the long-side direction (Z'-axis direction) of the AT-cut crystal vibration plate 2. The second extended portion 201c extends in the short-side direction (X-axis direction) of the AT-cut crystal vibration plate 2 and serves to connect ends of extension of the first extended portions 201b. The second extended portion 201c is connected to a first extraction electrode 203 extracted from the first driving electrode 25. The first mounting terminal 27, therefore, is electrically connected to the first driving electrode 25 through the first extraction electrode 203 and the first sealing pattern 201. There is no electrode formed in a region; electrode-less region, between the second mounting terminal 28 and the second extended portion 201c extending in the short-side direction of the AT-cut crystal vibration plate 2. This electrode-less region may ensure that the first sealing pattern 201 and the second mounting terminal 28 are electrically insulated from each other.

On the back-surface side of the AT-cut crystal vibration plate 2 is formed a second sealing pattern 202 to which the second resin film 4 is joined, as illustrated in FIG. 5. The second sealing pattern 202 is formed in a rectangular circular shape in a manner that the rectangular vibrating portion 21 is surrounded by this sealing pattern. The second sealing pattern 202 includes a connecting portion 202a, first extended portions 202b, and a second extended portion 202c. The connecting portion 201 is continuous to the second mounting terminal 28. The first extended portions 202b extend from both ends of the connecting portion 202a in the long-side direction of the AT-cut crystal vibration plate 2. The second extended portion 202c extends in the short-side direction of the AT-cut crystal vibration plate 2 and serves to connect ends of extension of the first extended portions 202b. The connecting portion 202a is connected to a second extraction electrode 204 extracted from the second driving electrode 26. The second mounting terminal 28, therefore, is electrically connected to the second driving electrode 26 through the second extraction electrode 204 and the second sealing pattern 202. There is no electrode formed in a region; electrode-less region, between the first mounting terminal 27 and the second extended portion 202c extending in the short-side direction of the AT-cut crystal vibration plate 2. This electrode-less region may ensure that the second sealing pattern 202 and the first mounting terminal 27 are electrically insulated from each other.

As illustrated in FIG. 2, the first extended portions 201b of the first sealing pattern 201 extending in the long-side direction of the AT-cut crystal vibration plate 201b are smaller in width than the outer frame 23 extending in the long-side direction. This drawing also shows that the electrode-less region is present on both sides of the first extended portions 201b in the direction of width (vertical direction on FIG. 2).

Of the electrode-less regions on both sides of the first extended portions 201b, the electrode-less region on the outer side is extending as far as the first mounting terminal 27 and is continuous to the electrode-less region between the second mounting terminal 28 and the second extended portion 201c. Thus, the connecting portion 201a, first extended portions 201b, and second extended portion 201c of the first sealing pattern 201 are surrounded on their outer side by the electrode-less region in a substantially equal width. This electrode-less region extends from the outer side at one end of the connecting portion 201a extending in the short-side direction of the AT-cut crystal vibration plate 2, then extends along one of the first extended portions 201b, and further extends from the end of extension of the first extended portion 201b along the second extended portion 201c. Then, the electrode-less region extends from the end of extension of the second extended portion 201c and further extends along the other one of the first extended portions 201b to the outer side at the other end of the connecting portion 201a.

An electrode-less region is formed on the inner side of the connecting portion 201a of the first sealing pattern 201 in the direction of width. This electrode-less region is continuous to the electrode-less region on the inner side of the first extended portions 201b. An electrode-less region is formed on the inner side of the second extended portion 201c in the direction of width, except the first extraction electrode 203 at the coupling portion 24. This electrode-less region is continuous to the electrode-less region on the inner side of the first extended portions 201b. Thus, the connecting portion 201a, first extended portions 201b, and second extended portion 201c of the first sealing pattern 201 are surrounded on their inner side by the electrode-less region having a rectangular circular shape in plan view, except the first extraction electrode 203 at the coupling portion 24.

As illustrated in FIG. 5, the first extended portions 202b of the second sealing pattern 202 extending in the long-side direction of the AT-cut crystal vibration plate 2 are smaller in width than the outer frame 23 extending in the long-side direction. This drawing also shows that there are electrode-less regions on both sides of the first extended portions 201b in the direction of width (vertical direction on FIG. 5).

Of the electrode-less regions on both sides of the first extended portions 202b, the electrode-less region on the outer side is extending as far as the second mounting terminal 28 and is continuous to the electrode-less region between the first mounting terminal 27 and the second extended portion 202c. Thus, the connecting portion 202a, first extended portions 202b, and second extended portion 202c of the second sealing pattern 202 are surrounded on their outer side by the electrode-less region in a substantially equal width. This electrode-less region extends from the outer side at one end of the connecting portion 202a extending in the short-side direction of the AT-cut crystal vibration plate 2, then extends along one of the first extended portions 202b, and further extends from the end of extension of the first extended portion 202b along the second extended portion 202c. Then, the electrode-less region extends from the end of extension of the second extended portion 202c and further extends along the other one of the first extended portions 202b to the outer side at the other end of the connecting portion 202a.

An electrode-less region is formed on the inner side of the connecting portion 202a of the second sealing pattern 202 in the direction of width, except the second extraction electrode 204 at the coupling portion 24. This electrode-less region is continuous to the electrode-less region on the inner side of the first extended portions 202b. An electrode-less region is formed on the inner side of the second extended portion 202c in the direction of width. This electrode-less region is continuous to the electrode-less region on the inner side of the first extended portions 201b. Thus, the connecting portion 202a, first extended portions 202b, and second extended portion 202c of the second sealing pattern 202 are surrounded on their inner side by the electrode-less region having a rectangular circular shape in plan view, except the second extraction electrode 204 at the coupling portion 24.

As described above, the first extended portions 201b and 202b of the first and second sealing patterns 201 and 202 are smaller in width than the width of the outer frame 23, the electrode-less regions are disposed on both sides of the first extended portions 201b and 202b in the direction of width, and the electrode-less regions are disposed on the inner side of the connecting portions 201a and 202a and the second extended portions 201c 202c in the direction of width. To form these electrode-less regions, the first and second sealing patterns 201 and 202, which were extended around lateral surfaces of the outer frame 23 at the time of sputtering, are patterned by photolithography and then removed by metal etching. The first and second sealing patterns 201 and 202, if extended around and left on lateral surfaces of the outer frame 23, may possibly cause short circuit, the risk of which may be successfully avoided in the described manner.

The first mounting terminals 27 on the main surfaces are thus electrically connected to each other, and the second mounting terminals 28 on the main surfaces are also electrically connected to each other. Therefore, either one of the main surfaces on front and back sides may be available at the time when the crystal vibrator 1 is mounted on, for example, a circuit board.

The first and second resin films 3 and 4, which are rectangular films, are bonded to front and back surfaces of the AT-cut crystal vibration plate 2 to seal the vibrating portion 21 of the AT-cut crystal vibration plate 2. These rectangular first and second resin films 3 and 4 are so sized that covers a rectangular region of the AT-cut crystal vibration plate 2 except the first and second mounting terminals 27 and 28 at both ends in the longitudinal direction of this vibration plate 2. The first and second resin films 3 and 4 are bonded to this rectangular region except the first and second mounting terminals 27 and 28. At the time, these first and second resin films 3 and 4 are firmly bonded to the first and second sealing patterns 201 and 202 having a rectangular circular shape.

In this embodiment, the first and second resin films 3 and 4 may be heat-resistant resin films, for example, films made of a polyimide resin and having heat resistance to approximately 300° C. The first and second resin films 3 and 4 made of a polyimide resin are essentially transparent, however, may possibly be opaque under certain conditions of pressure bonding under heat which will be described later. The first and second resin films 3 and 4 may be optionally transparent, semi-transparent, or opaque.

The material of the first and second resin films 3 and 4 may not necessarily be selected from the polyimide resins and may be selected from resins classified in the category of super engineering plastics, specific examples of which may include polyamide resins and polyether ether ketone resins.

The first and second resin films 3 and 4 have, on their front and back surfaces, thermoplastic adhesive layers, which are formed in the entire areas of these surfaces. In the first and second resin films 3 and 4, circumferential ends of their rectangular shapes are joined by, for example, hot pressing to the outer frame 23 of the AT-cut crystal vibration plate 2 in a manner that the vibrating portion 21 is sealed with these resin films.

By thus using the heat-resistant resin films for the first and second resin films 3 and 4, the crystal vibrator 1 may be resistant to high temperatures and thus unlikely to deform during the reflow soldering employed at the time when the crystal vibrator 1 is mounted by soldering on, for example, a circuit board.

The first, second driving electrode 25, 26; first, second mounting terminal 27, 28; first, second sealing pattern 201, 202; and first, second extraction electrode 203, 204 of the AT-cut crystal vibration plate 2 may have, for example, a multilayered structure including a ground layer made of Ti (titanium) or Cr (chromium), an Au (metal) layer formed on the ground layer, and a Ti, Cr or Ni (nickel) layer further formed on the Au layer.

In this embodiment, the ground layer is a Ti layer, and Au and Ti are deposited in layers on the ground layer. The uppermost layer thus made of Ti, instead of Au, may provide an improved bonding strength to the polyimide resin.

In the first and second sealing patterns 201 and 202 to which the rectangular first and second resin films 3 and 4 are bonded, their uppermost layers include Ti, Cr, or Ni (or oxide thereof) as described above. Such a material may conduce to a better bonding strength than other materials, like Au, to the first and second resin films 3 and 4.

This embodiment provides the following technical features to improve the reliability of electrical connection between the first mounting terminals 27 and between the second mounting terminals 28 on the main surfaces. At one end in the long-side direction of the AT-cut crystal vibration plate 2 rectangular in plan view (Z'-axis direction), the first cutout 207 is formed inward (toward the vibrating portion 21) from one of the main surfaces to the other main surface of the AT-cut crystal vibration plate 2, and the electrode is deposited on this first cutout 207. This combination of the cutout and electrode constitutes the first castellation 205. At the other end in the long-side direction of the AT-cut crystal vibration plate 2, the second cutout 208 is formed inward (toward the vibrating portion 21) from one of the main surfaces to the other main surface of the AT-cut crystal vibration plate 2, and the electrode is deposited on this second cutout 208. This combination of the cutout and electrode constitutes the second castellation 206.

The first castellation 205 and the second castellation 206 are respectively formed at central positions on opposing short sides of the AT-cut crystal vibration plate 2 rectangular in plan view. These castellations provide electrical connection between the first mounting terminals 27 and between the second mounting terminals 28 on the main surfaces.

When the first and second mounting terminals 27 and 28 formed on the respective main surfaces are bonded with a solder to, for example, a circuit board, the solder may generate a stress, which may be acted upon the first and second mounting terminals 27 and 28 and the first and second castellations 205 and 206 that interconnect these mounting terminals. These castellations, therefore, may preferably be formed in a manner that such a stress does not become disproportionate between the mounting terminals that have been bonded to the circuit board. To this end, the first castellation 205 and the second castellation 206 may preferably be line symmetric with respect to a bisector that bisects at least the opposing sides extending in the Z'-axis direction (long sides) and then extends in the X-axis direction of the rectangular AT-cut crystal vibration plate 2.

More desirably, the first and second castellations 205 and 206, in addition to the line symmetry with respect to the before-mentioned bisector, may also be line symmetric with respect to a bisector that bisects the opposing sides extending in the X-axis direction (short sides) and then extends in the Z'-axis direction of the rectangular AT-cut crystal vibration plate 2.

The first and second castellations 205 and 206, which are formed by cutting the outer surface of the AT-cut crystal vibration plate, are dented inward. The first and second castellations 205 and 206, therefore, may be less likely to be worn than electrodes formed on the outer surface. This may advantageously prevent the risk of breakage that may be caused by any damage to these castellations.

The first and second cutouts 207 and 208 of the first and second castellations 205 and 206 are formed in a substantially rectangular shape in plan view. As illustrated in FIGS. 2 and 5, the first and second cutouts 207 and 208 respectively include first end surfaces 207a and 208a, second end surfaces 207b and 208b facing the first end surfaces, and third end surfaces 207c and 208c respectively orthogonal to the end surfaces 207a and 207b, and 208a and 208b.

In the AT-cut crystal vibration plate 2 rectangular in plan view, its front and back main surfaces are XZ' planes, as described earlier. Further, the short-side direction (vertical direction on FIGS. 2 and 5) of this plate is X-axis direction, and the long-side direction of this plate (lateral direction on FIGS. 2 and 5) is Z'-axis direction.

As illustrated in FIGS. 2 and 5, the first and second cutouts 207 and 208 respectively have the first end surfaces 207a and 208a extending along the Z' axis and located on the −X-axis side. The first end surfaces 207a and 208a are end surfaces at ends in the −X-axis direction.

FIG. 4 is a schematic view in cross section along B-B line of FIG. 2. Of the first end surfaces 207a and 208a of the first and second cutouts 207 and 208, the drawing of FIG. 4 typically shows the first end surface 208a of the second cutout 208.

The first end surface 208a includes a first inclined face 208a1 and a second inclined face 208a2. The first inclined face 208a1 is so inclined that protrudes toward the −X axis, directed from one main surface to the other main surface of the AT-cut crystal vibration plate 2 to which the first resin film 3 is bonded. The second inclined face 208a2 is so inclined that protrudes toward the −X axis, directed from the other main surface to the one main surface of the AT-cut crystal vibration plate 2 to which the second resin film 4 is bonded. The second inclined face 208a2 is continuous to the first inclined face 208a1.

The first inclined face 208a1 of the first end surface 208a in the second cutout 208 makes an obtuse angle with one of the main surfaces of the AT-cut crystal vibration plate 2 to which the first resin film 3 is bonded. Similarly, the second inclined face 208a2 of the second end surface 208a makes an obtuse angle with the other main surface of the AT-cut crystal vibration plate 2 to which the second resin film 4 is bonded. Further, the first and second inclined faces 208a1 and 208a2 of the first end surfaces 208a also make an obtuse angle with each other.

As with the first end surface 208a of the second cutout 208, the first, second inclined face 207a1, 207a2 of the first end surface 207a in the first cutout 207 illustrated in FIG. 3 makes an obtuse angle with a respective one of the main surfaces of the AT-cut crystal vibration plate 2.

In the first end surfaces 207a and 208a of the first and second cutouts 207 and 208 which are the end surfaces on the −X-axis side extending along the Z' axis in the first and second castellations 205 and 206, X-axis thus have obtuse angles.

Of the second end surfaces 207b and 208b of the first and second cutouts 207 and 208 in the first and second castellations 205 and 206 on the side of the +X axis extending along the Z' axis, which are the end surfaces 207b and 208b facing the first end surfaces 207a and 208a, FIG. 4 typically shows the second end surface 208b of the second cutout 208, in which two inclined faces 208b1 and 208b2 make a sharp angle.

The third end surfaces 207c and 208c of the first and second cutouts 207 and 208 in the first and second castellations 205 and 206, which are the end surfaces on the side of the Z' axis extending along the X axis, each make a sharp angle with one of the main surfaces of the AT-cut crystal vibration plate 2 to which the first resin film 3 is bonded or with the other main surface of the AT-cut crystal vibration plate 2 to which the second resin film 4 is bonded, as in the schematic cross-sectional view of FIG. 3.

The first and second cutouts 207 and 208 cut into the first and second castellations respectively have the first end surfaces 207a and 208a on the −X-axis side extending along the Z' axis. These first end surfaces 207a and 208a on the −X-axis side, in which X-axis each have an obtuse angle, may successfully control the risk of breakage, as compared with corners having right and/or sharp angles. This may favorably improve the reliability of electrical connection between the first mounting terminals 27 and between the second mounting terminals 28 on the main surfaces of the AT-cut crystal vibration plate 2.

In order to form the first end surfaces 207a and 208b in which the first inclined faces 207a1 and 208a1 make an obtuse angle and the second inclined faces 207a2 and 208a2 also make an obtuse angle, the following conditions may preferably be satisfied in view of crystal anisotropy during the etching of the AT-cut crystal vibration plate 2.

Figure 6:
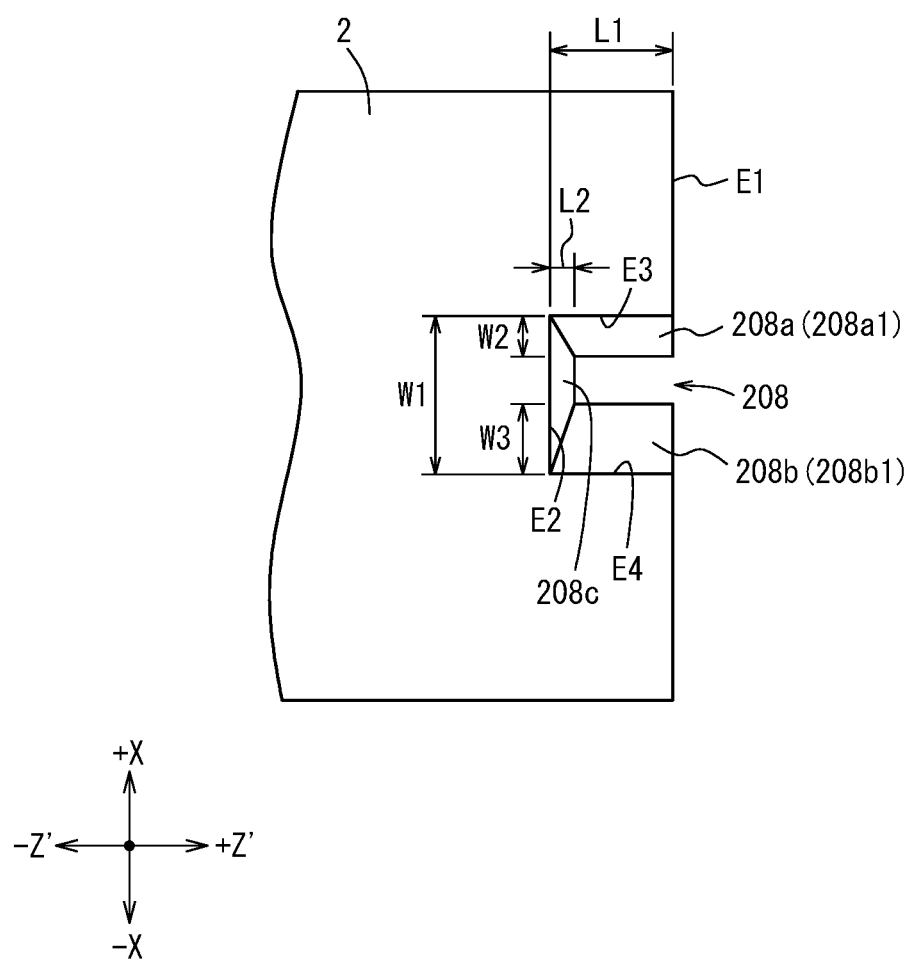
FIG. 6 is a schematic plan view illustrated to describe the formation of end surfaces of a second cutout.

FIG. 6 is a schematic plan view of the AT-cut crystal vibration plate 2 in the vicinity of the second cutout 208 when observed from the side of one main surface, in which electrodes of, for example, the second mounting terminal 28 are not illustrated. While the second cutout 208 is hereinafter described as a typical example, what is described herein is also applicable to the first cutout 207.

In FIG. 6 are illustrated the inclined faces illustrated in FIG. 4; the first inclined face 208a1 of the first end surface 208a on the −X-axis side inclined in a manner that protrudes toward the −X axis, directed from one main surface to the other main surface, and the inclined face 208b1 of the second end surface 208b on the +X-axis side inclined in a manner that protrudes toward the +X axis, directed from one main surface to the other main surface.

In FIG. 6 is further shown the third end surface 208c illustrated in FIG. 4 that extends along the X axis. This third end surface 208c is an inclined face inclined in a manner that protrudes toward the +Z'-axis side, directed from one main surface to the other main surface.

In the drawing of FIG. 6, a reference sign L1 refers to a dimension, in the second cutout 208 cut in a rectangular shape in plan view, measured from an end edge E1 on the +Z'-axis side of the AT-cut crystal vibration plate 2 to an end edge E2 on the back side of the second cutout 208 on one main surface; i.e., a dimension (length) in the Z'-axis direction of the second cutout 208 on one main surface. This dimension L1 corresponds to the cutting depth of the second cutout 208.

In this drawing, a reference sign W1 refers to a dimension, in the second cutout 208 on one main surface, measured from an end edge E3 on the −X-axis side to an end edge E4 on the +X-axis side; i.e., a dimension (length) in the X-axis direction of the second cutout 208 on one main surface. This dimension W1 corresponds to the cutting width of the second cutout 208.

Further, the following reference signs are used to refer to different dimensions in plan view; L2 refers to a dimension in the second cutout 208 on one main surface, measured from the end edge E2 on the back side to the protruding end of the third end surface 208c, W2 refers to a dimension in the second cutout 208 on one main surface, measured from the end edge E3 on the −X-axis side to the protruding end of the first end surface 208a, and W3 refers to a dimension in the second cutout 208 on one main surface, measured from the end edge E4 on the +X-axis side to the protruding end of the second end surface 208b.

To form, in the second cutout 208, the first and second inclined faces 208a1 and 208b1 of the first end surface 208a on the −X-axis side and two inclined faces 208a2 and 208b2 of the second end surface 208b2 on the +X-axis side, the dimension L1 in the Z'-axis direction of the second cutout 208 on one main surface may preferably be expressed as follows.

L1≥0.85t, where "t" refers to the thickness of the AT-cut crystal vibration plate 2.

Thus, the dimension L1 of the second cutout 208 on one main surface in the Z'-axis direction may preferably be greater than or equal to 85% of the thickness "t" of the AT-cut crystal vibration plate 2.

At the time when the etching operation is completed, the dimension L1 in the second cutout 208 measured in the Z'-axis direction may be thus allowed to have the following relationship with the dimension L2 in the second cutout 208 on one main surface, measured from the end edge E2 on the back side to the protruding end of the third end surface 208c.

$$L1 > L2$$

Specifically, the inclined faces 208a1, 208b1, 208a2 and 208b2 of the first and second end surfaces 208a and 208b on the X-axis side of the second cutout 208 may be successfully formed without these inclined faces being buried in the third end surface 208c protruding toward the +Z'-axis side.

The dimension W1 in the X-axis direction of the second cutout 208 on one main surface may preferably be expressed as follows.

$$W1 \geq 1.2t$$

Specifically, the dimension W1 in the X-axis direction of the second cutout 208 on one main surface may preferably be greater than or equal to 120% of the thickness "t" of the AT-cut crystal vibration plate 2.

At the time when the etching operation is completed, the dimension W1 may be thus allowed to have the following relationship with a summed value of the dimension W2 in the second cutout 208 on one main surface, measured from the end edge E3 on the −X-axis side to the protruding end of the first end surface 208a, and the dimension W3 in the second cutout 208 on one main surface, measured from the end edge E4 on the +X-axis side to the protruding end of the second end surface 208b (W2+W3)

$$W1 > (W2 + W3)$$

Specifically, the second cutout 208 may be penetrated through both of the main surfaces, and two end surfaces may be thus formed; first end surface 208a on the −X-axis side, and second end surface 208b on the +X-axis side.

The dimension L1 in the Z'-axis direction of the second cutout 108 on main surface may preferably be less than or equal to 12% of the external dimension in the Z'-axis direction of the AT-cut crystal vibration plate 2 (length of a long side, in this embodiment).

By defining the dimension L1 to be less than or equal to 12% of the external dimension in the Z'-axis direction of the AT-cut crystal vibration plate 2, an adequately large area may be secured for the vibrating portion 21, which may avoid any adverse impact on designing of the vibrating portion 21. In this embodiment, the dimension L1 is set to 7% of the external dimension in the Z'-axis direction of the AT-cut crystal vibration plate 2.

The dimension W1 in the X-axis direction of the second cutout 208 on one main surface may preferably be less than or equal to 35% of the external dimension in the X-axis direction of the AT-cut crystal vibration plate 2 (length of a short side, in this embodiment).

By defining the dimension W1 to be less than or equal to 35% of the external dimension in the X-axis direction of the AT-cut crystal vibration plate 2, an adequately large area may be secured for the first and second mounting terminals 27 and 28, which may avoid any adverse impact on a required mounting strength. In this embodiment, the dimension W1 is set top 20% of the external dimension in the X-axis direction of the AT-cut crystal vibration plate 2.

The description given so far focusing on one of the main surfaces may also be applicable to the other one of the main surfaces. The dimensions L1 and W1 may preferably satisfy the before-mentioned conditions for at least one of the main surfaces.

Next, a method for producing the crystal vibrator 1 according to this embodiment is hereinafter described.

FIGS. 7A to 7E are schematic views in cross section that illustrate steps of producing the crystal vibrator 1.

Figure 7A:
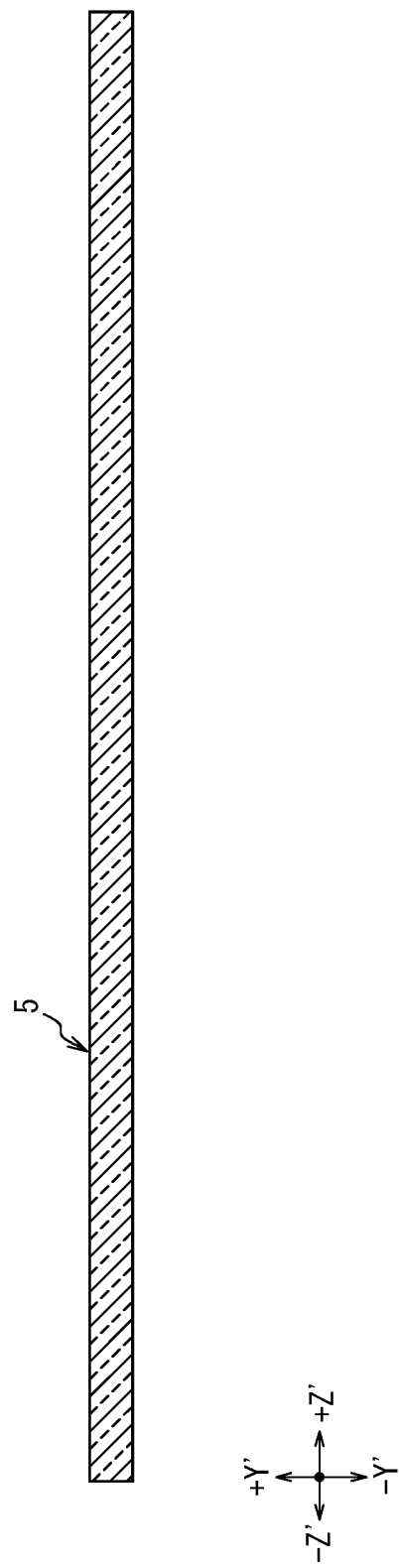
FIG. 7A is a schematic view in cross section of the crystal vibrator illustrated to describe steps of manufacturing the crystal vibrator of FIG. 1.

First, an unprocessed AT-cut crystal wafer (AT-cut crystal plate) 5 is prepared, which is illustrated in FIG. 7A. As illustrated in FIG. 7B, this AT-cut crystal wafer 5 is processed by wet etching using the technique of photolithography into pieces that constitute the outer shape of a vibrator to be obtained; a plurality of crystal vibration plates 2a and frames supporting these vibration plates (not illustrated in the drawings). Then, the AT-cut crystal vibration plates 2a are processed to have outer frames 23a, vibrating portions 21a thinner than the outer frames 23a, and cutouts 207 and 208 that will constitute the castellations 205 and 206.

The end surfaces 207a to 207c and 208a to 208c respectively having the inclined faces are formed as a result of this wet etching of the AT-cut crystal wafer 5 and crystal anisotropy associated with crystal orientation.

Figure 7C:
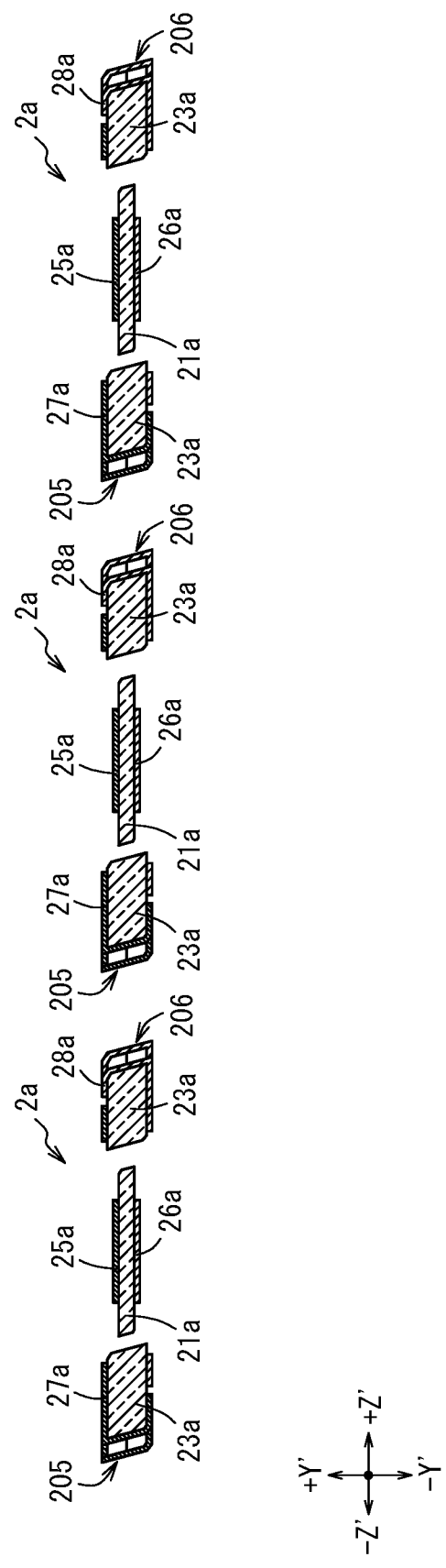
FIG. 7C is a schematic view in cross section of the crystal vibrator illustrated to describe steps of manufacturing the crystal vibrator of FIG. 1.

Then, first and second driving electrodes 25a and 26a and first and second mounting terminals 27a and 28a are formed at predetermined positions in each of the AT-cut crystal vibration plates 2a by sputtering or vapor deposition and photolithography, as illustrated in FIG. 7C. At the time, electrodes are deposited on the cutouts 207 and 208 to form the castellations 205 and 206.

Figure 7D:
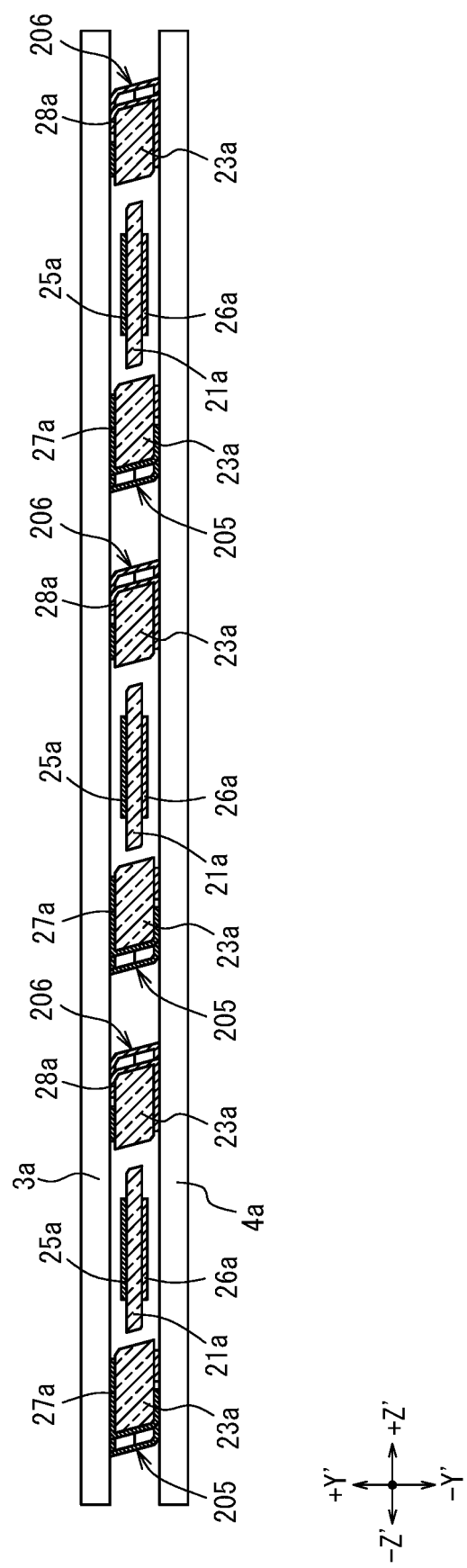
FIG. 7D is a schematic view in cross section of the crystal vibrator illustrated to describe steps of manufacturing the crystal vibrator of FIG. 1.
Figure 7E:
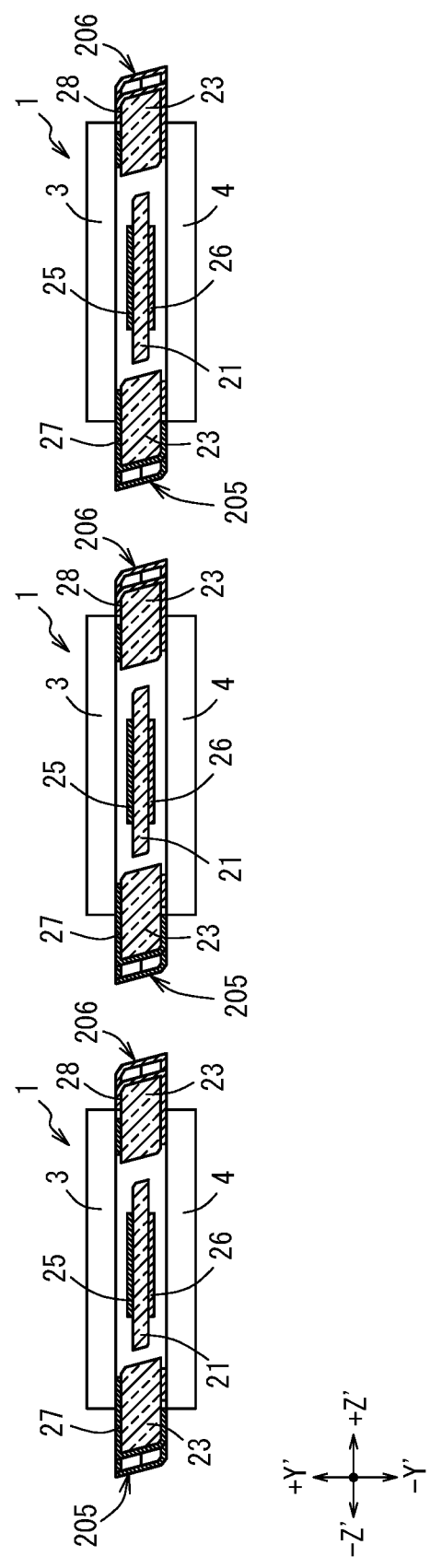
FIG. 7E is a schematic view in cross section of the crystal vibrator illustrated to describe steps of manufacturing the crystal vibrator of FIG. 1.

Further, continuous resin films 3a and 4a are bonded under heat by pressure bonding to the AT-cut crystal vibration plates 2a, as illustrated in FIG. 7D, in a manner that front and back main surfaces of the AT-cut crystal vibration plates 2a are covered with these resin films. Thus, the vibrating portions 21a of the AT-cut crystal vibration plates 2a are tightly sealed.

The vibrating portions 21a are sealed with the resin films 3a and 4a in an inactive gas atmosphere using, for example, nitrogen gas.

Then, the continuous resin films 3a and 4a are cut at appropriate positions correspondingly to the respective crystal vibration plates 2 in a manner that the first and second mounting terminals 27 and 28 are partly exposed. Then, any unnecessary parts of the films are removed, and the crystal vibration plates 2 are broken into separate pieces.

A plurality of the crystal vibrators 1 illustrated in FIG. 1 are thus obtained.

In the crystal vibrator 1 according to this embodiment, the first and second castellations 205 and 206 are formed by cutting the outer surface of the AT-cut crystal vibration plate 2 toward the inner side. These castellations are, therefore, dented inward, as compared with electrodes formed on the outer surface. This may advantageously prevent the risk of breakage that may be caused by any damage to these castellations.

The first and second castellations 205 and 206 have the first end surfaces 207a and 208a located on the −X-axis side and extending along the Z' axis. In these first end surfaces 207a and 208a, all of the corners have obtuse angles, including those made by the first inclined faces 207a and 208a and the second inclined faces 207b and 208b. Thus, possible breakage may be less likely to occur than in such corners that are formed at sharp and right angles.

This may improve the reliability of electrical connection between the first mounting terminals 27 and between the second mounting terminals 28 on the main surfaces of the AT-cut crystal vibration plate 2.

In the crystal vibrator 1 according to this embodiment, the first and second resin films 3 and 4 are bonded to the front and back main surfaces of the AT-cut crystal vibration plate 2. Conventionally, recess-formed bases made of an insulation material such as ceramic may be often prepared, in which case the bases each containing a crystal vibration piece in its recess is air-tightly sealed with a lid member bonded to the base. This embodiment, however, may eliminate the need to prepare high-priced bases or lid members, unlike the known art.

This may successfully achieve cost reduction of the crystal vibrator 1, allowing the crystal vibrator 1 to be inexpensively produced and made available.

Further advantageously, the crystal vibrator 1 thus produced may be reduced in thickness (reduced in height), as compared with the known art in which, for example, a base is mounted with a crystal vibration piece and sealed with a lid member.

In the crystal vibrator 1 according to this embodiment, the vibrating portion 21 is sealed with the first and second resin films 3 and 4. The crystal vibrator 1 thus structured may be relatively inferior in air-tightness, as compared with the known art in which, for example, a vibration piece-mounted base is air-tightly sealed with a metal-made or glass-made lid member joined to the base. As a result, the resonance frequency of such a crystal vibrator 1 may be more likely to degrade with time than in the known art.

The standards for frequency deviations may be rather weakly regulated for BLE (Bluetooth (registered trademark) Low Energy), among all of the applications associated with the near field communication. The crystal vibrator 1, which is an inexpensive, resin film-sealed vibrator, may be conveniently used in such applications.

In the embodiment described above, the first and second castellations 205 and 206 are each formed at one position on a respective one of the opposing sides of the AT-cut crystal vibration plate 2 rectangular in plan view. Instead, these castellations may be formed at two or more positions on the opposing sides.

The second cutouts 207 and 208 are not necessarily so shaped as described in the earlier embodiment. These cutouts may be optionally formed in any shapes that enable the formation of end surfaces extending along the Z' axis and located on the −X-axis side of the X axis of crystal.

In this embodiment, the first and second resin films 3 and 4 are bonded to the two main surfaces of the AT-cut crystal vibration plate 2 to seal the vibrating portion 21. Optionally, the vibrating portion 2 may be sealed with a resin film on one of the main surfaces of the AT-cut crystal vibration plate 2 and sealed with a conventional lid member on the other main surface.

The present invention is not necessarily applicable to crystal vibrators alone and may also be applicable to crystal vibration devices including crystal oscillators.

REFERENCE SIGNS LIST 1 crystal vibrator
2 crystal vibration plate
3 first resin film
4 second resin film
5 AT-cut crystal wafer
21 vibrating portion
23 outer frame
24 coupling portion
25 first driving electrode
26 second driving electrode
27 first mounting terminal
28 second mounting terminal
201 first sealing pattern
202 second sealing pattern
205 first castellation
206 second castellation
207 first cutout
208 second cutout
207a, 208a first end surface
207b, 208b second end surface
207c, 208c third end surface
207a1, 208a1 first inclined face
207a2, 208a2 second inclined face

The invention claimed is:

1. A crystal vibration device, comprising:
an AT-cut crystal vibration plate comprising a first driving electrode and a second driving electrode, the first driving electrode being formed on one of main surfaces on both sides of the AT-cut crystal vibration plate, the second driving electrode being formed on another one of the main surfaces, the AT-cut crystal vibration plate further comprising first and second mounting terminals that are respectively connected to the first and second driving electrodes; and
first and second sealing members respectively covering the first and second driving electrodes of the AT-cut crystal vibration plate, the first and second sealing members being respectively joined to the main surfaces on both sides of the AT-cut crystal vibration plate in a manner that at least a portion of the first and second mounting terminals is exposed,
the first mounting terminals being formed on both of the main surfaces at one end of the AT-cut crystal vibration plate,
the second mounting terminals being formed on both of the main surfaces at another end of the AT-cut crystal vibration plate,
the first and second mounting terminals being directly joined to a circuit board or other substrate,
a first castellation and a second castellation being respectively formed at the one end and at the another end of the AT-cut crystal vibration plate,
the first and second castellations being each formed by depositing an electrode on a cutout formed from the one of the main surfaces to the another one of the main surfaces,
the first castellation and the second castellation serving to interconnect the first mounting terminals and to interconnect the second mounting terminals that are respectively formed on the main surfaces,
the cutouts of the first and second castellations each comprising a first end surface and a second end surface extending along Z' axis of crystal and facing each other,
the first end surfaces each comprising a first inclined face and a second inclined face,
the first inclined faces being each inclined from the one of the main surfaces to the another one of the main surfaces in a manner that protrudes toward the second end surface; and
the second inclined faces being each inclined from the another one of the main surfaces to the one of the main surfaces in a manner that protrudes toward the second end surface, the second inclined face being continuous to the first inclined face, and
an angle made by the first and second inclined faces being an obtuse angle.

2. The crystal vibration device according to claim 1, wherein
dimensions of the cutouts in a direction along the Z' axis on at least one of the main surfaces are greater than or equal to 85% of a thickness of the AT-cut crystal vibration plate.

3. The crystal vibration device according to claim 1 or 2, wherein
dimensions of the cutouts in a direction along the X axis of crystal on at least one of the main surfaces are greater than or equal to 120% of the thickness of the AT-cut crystal vibration plate.

4. The crystal vibration device according to claim 1 or 2, wherein
the AT-cut crystal vibration plate has a rectangular shape in plan view, and
the first castellation and the second castellation are respectively formed at central positions on opposing sides of the rectangular shape in a direction along the X axis of crystal.

5. The crystal vibration device according to claim 3, wherein the AT-cut crystal vibration plate has a rectangular shape in plan view, and the first castellation and the second castellation are respectively formed at central positions on opposing sides of the rectangular shape in the direction along the X axis.

6. The crystal vibration device according to claim 1 or 2, wherein
at least one of the first and second sealing members is a film including a resin.

7. The crystal vibration device according to claim 3, wherein
at least one of the first and second sealing members is a film including a resin.

8. The crystal vibration device according to claim 1 or 2, wherein
the AT-cut crystal vibration plate comprises:
a vibrating portion comprising the first and second driving electrodes formed on the main surfaces on both sides; and
an outer frame surrounding an outer circumference of the vibrating portion and coupled to the vibrating portion through a coupling portion,
the vibrating portion is smaller in thickness than the outer frame, and circumferential ends of the film are respectively joined to main surfaces on both sides of the outer frame to seal the vibrating portion.

9. The crystal vibration device according to claim 3, wherein
the AT-cut crystal vibration plate comprises:
a vibrating portion comprising the first and second driving electrodes formed on the main surfaces on both sides; and an outer frame surrounding an outer circumference of the vibrating portion and coupled to the vibrating portion through a coupling portion, the vibrating portion is smaller in thickness than the outer frame, and circumferential ends of the film are respectively joined to main surfaces on both sides of the outer frame to seal the vibrating portion.

10. The crystal vibration device according to claim 8, wherein a first sealing pattern is formed on one of the main surfaces on both sides of the outer frame, the first sealing pattern being a pattern to which the film is joined, the first sealing pattern being a pattern that surrounds the vibrating portion and that interconnects the first driving electrode and the first mounting terminal, and a second sealing pattern is formed on another one of the main surfaces on both sides of the outer frame, the second sealing pattern being a pattern to which the film is joined, the second sealing pattern being a pattern that surrounds the vibrating portion and that interconnects the second driving electrode and the second mounting terminal.

11. The crystal vibration device according to claim 9, wherein a first sealing pattern is formed on one of the main surfaces on both sides of the outer frame, the first sealing pattern being a pattern to which the film is joined, the first sealing pattern surrounding the vibrating portion and being formed to interconnect the first driving electrode and the first mounting terminal, and a second sealing pattern is formed on another one of the main surfaces on both sides of the outer frame, the second sealing pattern being a pattern to which the film is joined, the second sealing pattern surrounding the vibrating portion and being formed to interconnect the second driving electrode and the second mounting terminal.

12. The crystal vibration device according to claim 10, wherein the first sealing pattern and the second sealing pattern each have an extended portion extending along the Z' axis, and the extended portions have a width smaller than a width of the outer frame extending along the Z' axis.

13. The crystal vibration device according to claim 11, wherein the first sealing pattern and the second sealing pattern each have an extended portion extending along the Z' axis, and the extended portions have a width smaller than a width of the outer frame extending along the Z' axis.

14. The crystal vibration device according to claim 6, wherein the film includes a heat-resistant resin.

15. The crystal vibration device according to claim 7, wherein the film includes a heat-resistant resin.

16. The crystal vibration device according to claim 6, wherein the film comprises a thermoplastic adhesive layer on at least one surface thereof.

17. The crystal vibration device according to claim 7, wherein the film comprises a thermoplastic adhesive layer on at least one surface thereof.

* * * * *